United States Patent [19]
Jang

[11] Patent Number: 5,263,092
[45] Date of Patent: Nov. 16, 1993

[54] DIGITAL VOLUME CONTROL CIRCUIT

[75] Inventor: Sung-Chui Jang, Suwon, Rep. of Korea

[73] Assignee: SamSung Electronics Co., Ltd., Suwon, Rep. of Korea

[21] Appl. No.: 524,914

[22] Filed: May 18, 1990

[30] Foreign Application Priority Data

May 19, 1989 [KR] Rep. of Korea ............ 1989-6718

[51] Int. Cl.$^5$ ............................................. H03G 3/00
[52] U.S. Cl. ........................................................ 381/104
[58] Field of Search ............................... 381/94, 104

[56] References Cited

U.S. PATENT DOCUMENTS 5,040,220 8/1991 Iwamatsu .

FOREIGN PATENT DOCUMENTS 63-87000 4/1988 Japan .

OTHER PUBLICATIONS

Lancaster, CMOS Cookbook, 1979, pp. 352-353.
Chamberlin, Musical Applications of Microprocessors, 1980, pp. 348-351.

*Primary Examiner*—Forester W. Isen
*Attorney, Agent, or Firm*—Robert E. Bushnell

[57] ABSTRACT

A circuit for preventing deterioration of the sound quality in a digital volume control circuit for use in a digital audio system is disclosed. The circuit includes a digital signal processing circuit for generating digital audio data of a given bit, a digital level controller for receiving a level control data from a system controller to therefrom combine the digital audio data with a control data determined according to an amount of the level attenuation of the digital audio data, at least one control signal detector for detecting only the control data from the output of the digital level controller, at least one digital-to-analog converter for converting the digital audio data from the output of the digital level controller into an analog audio signal, and at least one gain controller operably connected with the control signal detector for receiving the analog audio signal to control the gain of the analog audio signal in response to each state of the control data from the control signal detector.

10 Claims, 7 Drawing Sheets

| DIGITAL LEVEL ATTENUATION | CONTROL WORD | | | | | | |
|---|---|---|---|---|---|---|---|
| | C0 (1) | C1 (1/2) | C2 (1/4) | C3 (1/8) | C4 (1/16) | C5 (1/32) | C6 (1/64) |
| 0dB | 1 | 0 | 0 | 0 | 0 | 0 | 0 |
| −6 dB ≈ | 1 | 1 | 0 | 0 | 0 | 0 | 0 |
| −12dB ≈ | 0 | 0 | 1 | 0 | 0 | 0 | 0 |
| −18dB ≈ | 0 | 0 | 0 | 1 | 0 | 0 | 0 |
| −24dB ≈ | 0 | 0 | 0 | 0 | 1 | 0 | 0 |
| −30dB ≈ | 0 | 0 | 0 | 0 | 0 | 1 | 0 |
| −36dB ≈ | 0 | 0 | 0 | 0 | 0 | 0 | 1 |

*FIG. 8*

| | CONTROL WORD | | | | | | | ANALOG SW STATE | | | | | | | INTEGER | OUTPUT VOLTAGE |
|---|---|---|---|---|---|---|---|---|---|---|---|---|---|---|---|---|
| | C0 | C1 | C2 | C3 | C4 | C5 | C6 | S0 | S1 | S2 | S3 | S4 | S5 | S6 | | |
| 0dB | 1 | 0 | 0 | 0 | 0 | 0 | 0 | ON | OFF | OFF | OFF | OFF | OFF | OFF | $-R_F/R_n$ | Vout |
| −6 dB | 0 | 1 | 0 | 0 | 0 | 0 | 0 | OFF | ON | OFF | OFF | OFF | OFF | OFF | $-R_F/R_0$ | $-V_{in}$ |
| −12dB | 0 | 0 | 1 | 0 | 0 | 0 | 0 | OFF | OFF | ON | OFF | OFF | OFF | OFF | $-R_F/R_1$ | $-(1/2)V_{in}$ |
| −18dB | 0 | 0 | 0 | 1 | 0 | 0 | 0 | OFF | OFF | OFF | ON | OFF | OFF | OFF | $-R_F/R_2$ | $-(1/4)V_{in}$ |
| −24dB | 0 | 0 | 0 | 0 | 1 | 0 | 0 | OFF | OFF | OFF | OFF | ON | OFF | OFF | $-R_F/R_3$ | $-(1/8)V_{in}$ |
| −30dB | 0 | 0 | 0 | 0 | 0 | 1 | 0 | OFF | OFF | OFF | OFF | OFF | ON | OFF | $-R_F/R_4$ | $-(1/16)V_{in}$ |
| −36dB | 0 | 0 | 0 | 0 | 0 | 0 | 1 | OFF | OFF | OFF | OFF | OFF | OFF | ON | $-R_F/R_5$ | $-(1/32)V_{in}$ |
| | | | | | | | | | | | | | | | $-R_F/R_6$ | $-(1/64)V_{in}$ |

FIG. 9

DIGITAL VOLUME CONTROL CIRCUIT

TECHNICAL BACKGROUND

The present invention relates to a digital volume control circuit for use in a digital audio system, and more particularly, to a circuit for preventing deterioration of the sound quality generated during operation in the digital volume control circuit.

A known digital volume level control is accomplished by multiplying an input digital audio data by a given number of multiplying coefficient, for which the digital audio system generally deals with 16-bit digital audio data of both right and left channels as shown in FIG. 1A, wherein a so-called "bit down" phenomenon, as seen by FIG. 1B, occurs when the level of more than 6-decibel(dB) is attenuated. As such, since the 16-bit audio data are shifted upon the attenuation, the audio data bits existing in the LSB (Least Significant Bit) of the digital audio data are removed, which is the occurrence of the bit down, thus resulting in deterioration of the sound quality due to reduction of the dynamic range of signal.

SUMMARY OF THE INVENTION

It is therefore an object of the present invention to provide a circuit for preventing deterioration of the sound quality in a digital volume control circuit, wherein a digital volume data and a control data generated according to level attenuation of the digital audio data are employed so that a gain of the digital volume data is controlled by the control data without occurrence of the bit-down.

To achieve the above object and other advantages of the present invention, a circuit for preventing deterioration of the sound quality in a digital volume control circuit for use in a digital audio system, comprises:

a digital signal processing circuit for generating digital audio data of a given bit;

a digital level controller for receiving a level control data from a system controller to therefrom combine the digital audio data with a control data determined according to an amount of the level attenuation of the digital audio data;

at least one control signal detector for detecting only the control data from the output of the digital level controller;

at least one digital-to-analog converter for converting the digital audio data from the output of the digital level controller into an analog audio signal; and at least one gain controller operably connected with the control signal detector, for receiving the analog audio signal to control the gain of the analog audio signal in response to each state of the control data from the control signal detector.

BRIEF DESCRIPTION OF THE ATTACHED DRAWINGS

For a better understanding of the invention and to show how the same may be carried into effect, reference will now be made, by way of example, to the accompanying diagrammatic drawings, in which:

FIG. 8 illustrates diagrammatically the amount of the digital level attenuation corresponding to each bit of the control word;

FIG. 9 illustrates diagrammatically the sequence of the volume level control operation according to the invention to a digital audio signal in accordance with each corresponding switching in the gain control circuit determined on the basis of the control word;

Figures 1A, 1B:
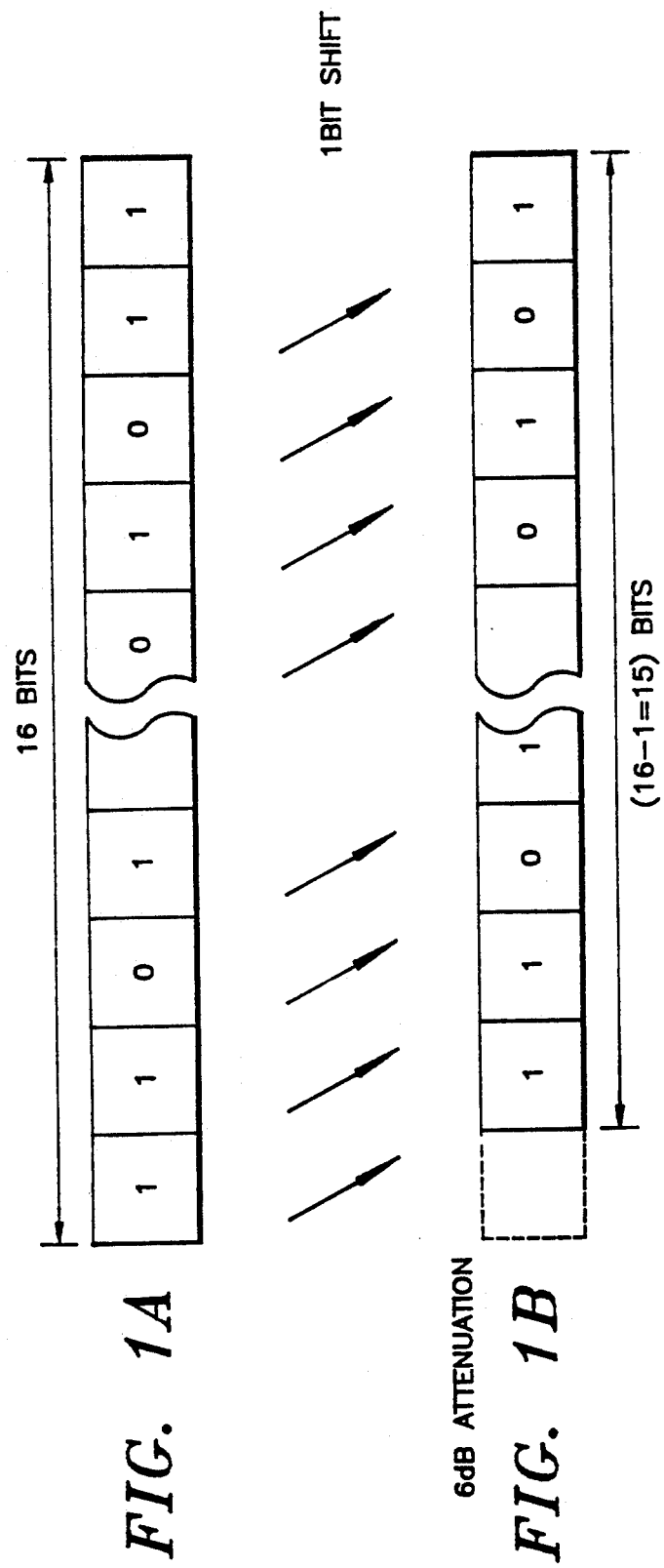
FIGS. 1A and 1B are schematic diagrams of exemplary digital audio data, wherein its bit structure is shown, and illustrating the occurrence of the "bit-down" phenomena upon the attenuation of gain level.
Figure 2:
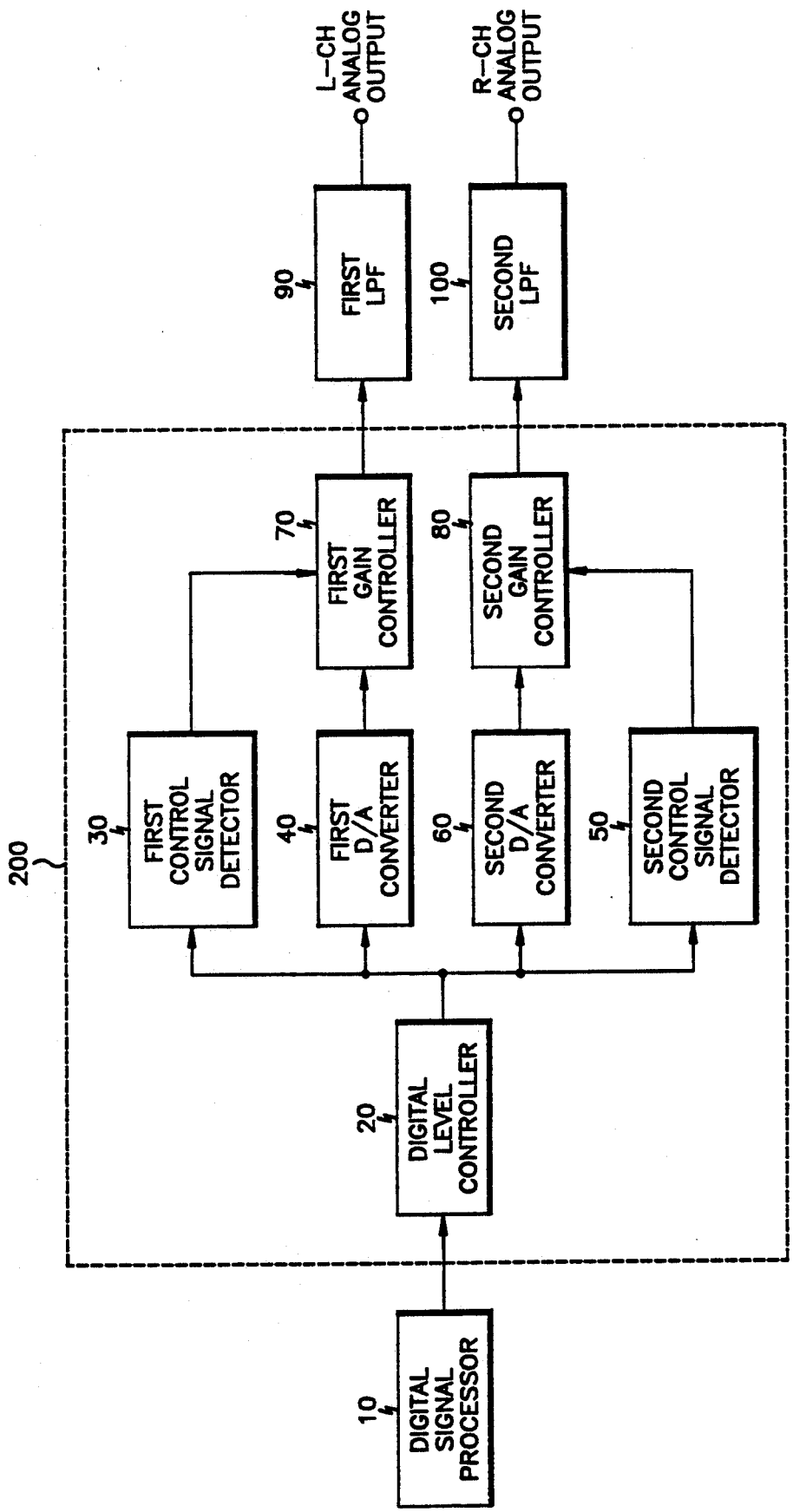
FIG. 2 is a block diagram of a digital volume control circuit according to the invention.
Figure 3:
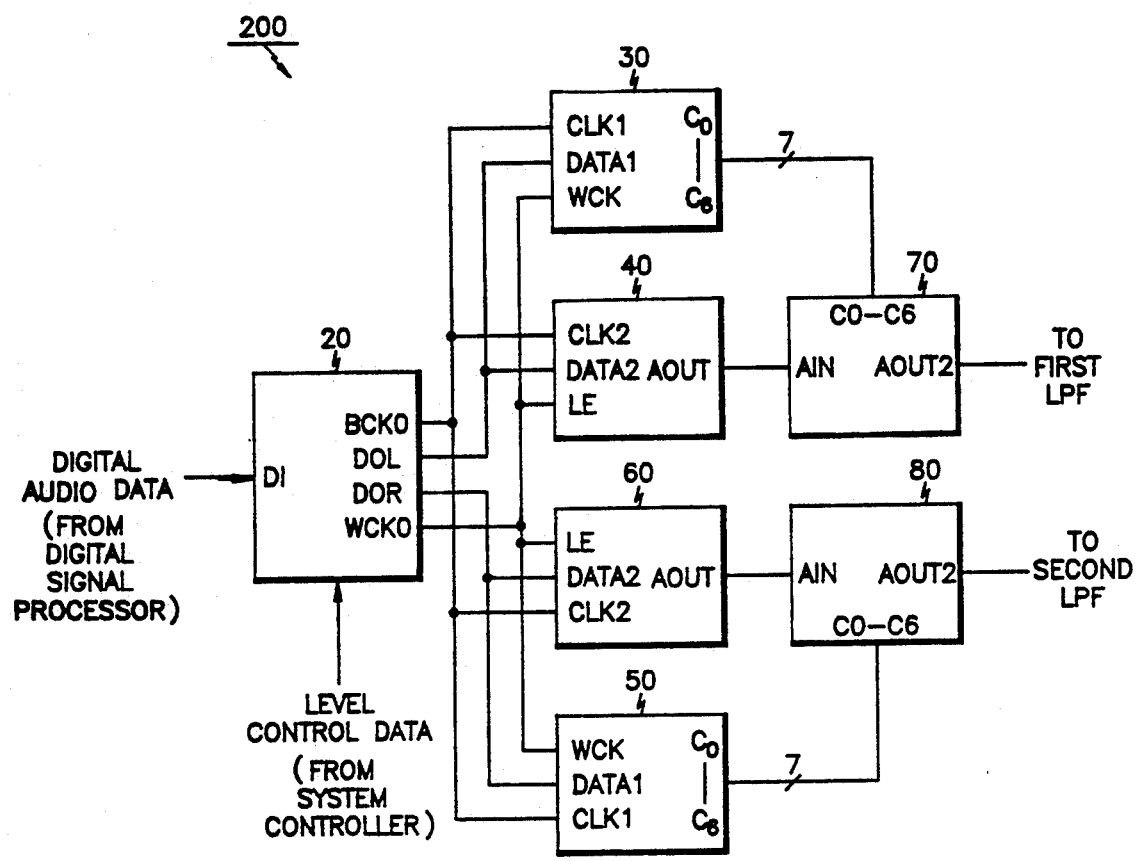
FIG. 3 is a detailed circuit diagram according to a preferred embodiment of the present invention, illustrating the electrical connection between blocks within a dashed part of FIG. 2.
Figure 10:
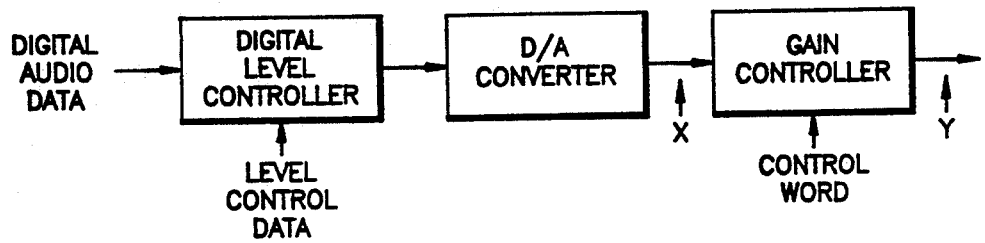
Figures 11A, 11B:
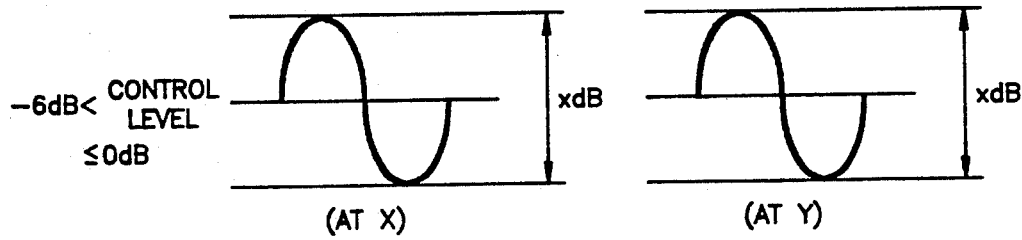
Figures 12A, 12B:
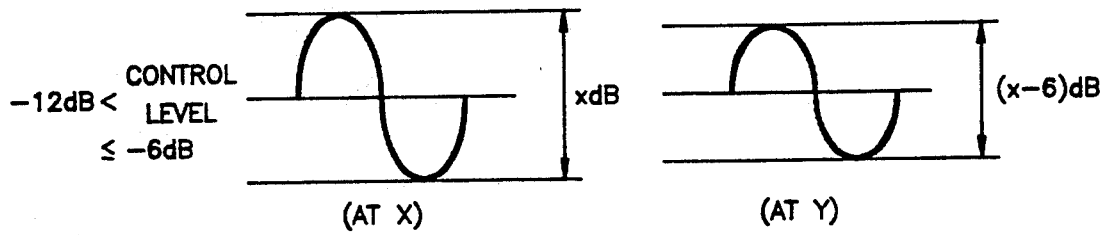
Figures 13A, 13B:
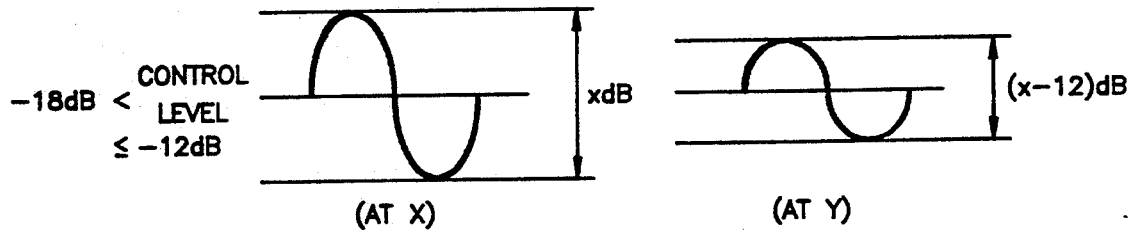

FIG. 10 is a schematic block diagram simplified of the FIG. 2, wherein X denotes a specified timing point after the D/A converter, while Y denotes another specified timing point after the gain controller; and FIGS. 11A, 11B, 12A, 12B, 13A, and 13B respectively illustrate each analog waveform at the point X or Y according to the corresponding level control status in the embodiment circuit of the invention.

DETAILED DESCRIPTION OF A PREFERRED EMBODIMENT

Referring FIG. 2, a digital signal processing circuit 10 generates a digital audio data. A digital level control circuit 20 separates channels of the digital audio data and combines the digital audio data with a control data depending on the level attenuation under the control of a system controller (not shown), while generating a word clock for separating the audio data and the control data, and a bit clock for data output. The left channel data of the digital level control circuit 20 is applied into a first control signal detecting circuit 30 to detect the control data by the bit clock pulses during a control word period of the word clock pulses. Also, the left channel data of the digital level control circuit 20 is applied into a first digital-to-analog converter 40 to convert the audio data according to the bit clock during the audio word period of the word clock. The output of the first analog to digital converter 40 is received by a first gain control circuit 70 to control the gain thereof according to the output of the first control signal detecting circuit 30. The output of the first gain control circuit 70 is filtered through a first low pass filter (LPF) 90.

The right channel data of the digital level control circuit 20 is applied into a second control signal detecting circuit 50 to detect the control data according to the bit clock during the control word period of the word clock. Also, the right channel data of the digital level control circuit 20 is applied into a second digital to analog converter 60 to convert the audio data into an analog signal according to the bit clock during the audio word period of the word clock. The output of the second digital to analog converter 60 is received by a second gain control circuit 80 to control the gain thereof according to the output of the second control signal detecting circuit 50. The output of the second gain control circuit 80 is filtered through a second low pass filter 100.

Figure 4:
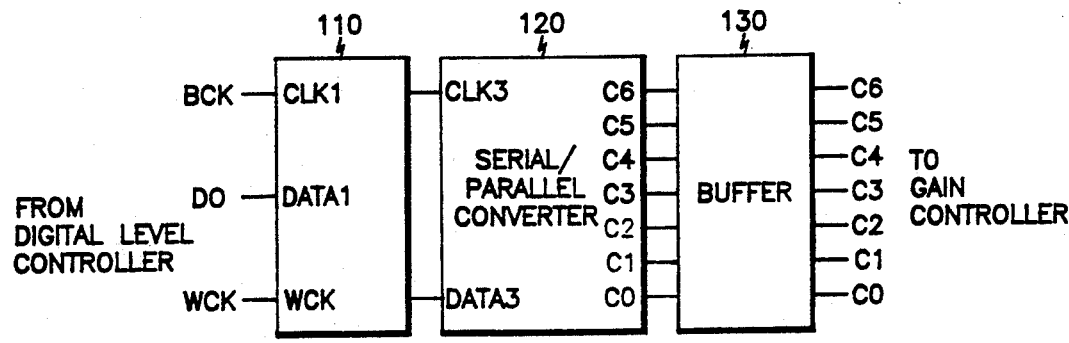
FIG. 4 is a detailed circuit diagram according to a preferred embodiment of a first or second control signal detector of FIG. 2.

Referring FIG. 4, each of the first and second control signal detecting circuits 30 and 50 comprises a control data detecting circuit 110 for detecting according to the bit clock only the control data of a corresponding channel generated from the digital level control circuit during the word clock period of the control data, a serial-to-parallel converter 120 for converting the serial output of the control data detecting circuit into parallel, and a buffer 130 for buffering the parallel control data of the serial-to-parallel converter 120 supplied to the first or second gain control circuit 70 or 80.

Figure 5:
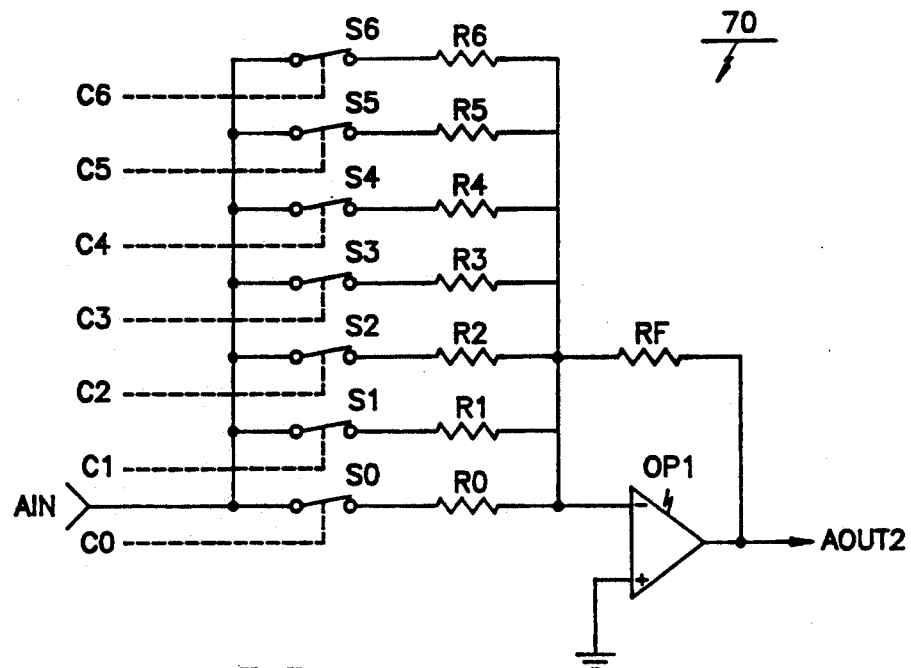
FIG. 5 is a detailed circuit diagram according to a preferred embodiment of a first or second gain controller of FIG. 2.

Referring to FIG. 5, each of the first and second gain control circuits 70 and 80 comprises a plurality of pairs of a switch S0-S6 and a resistor R0-R6 each coupled in series, each one of the switches being operably connected with each corresponding bit of the parallel control data C0-C6, an amplifier OP1 whose one input is connectable with said resistors, and a feedback resistor RF connectable between the input of the amplifier and an output thereof. On the basis of the state of the control data, the corresponding one of the switches is operated to control the gain of the analog audio signal. The number of the pairs of switches and resistors is same to the bit number of the control data.

Figure 6:
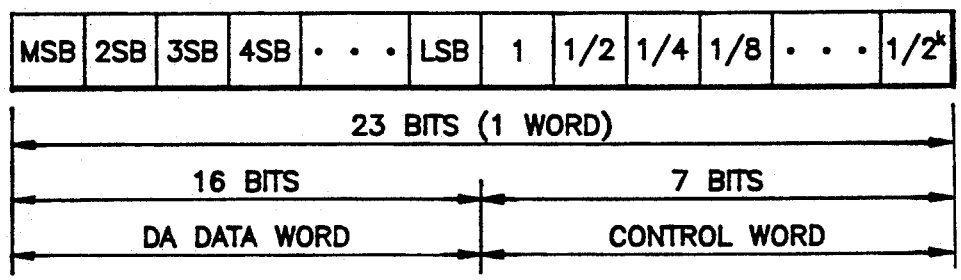
FIG. 6 is a schematic diagram illustrating an example of data format as an output of digital level control circuit, wherein a single word of 23 bits is comprised of a 16-bit audio data word and a 7-bit control data word.

Referring to FIG. 6, a 16-bit audio data word and a 7-bit control data word constitute a single total word of 23 bits. And referring to FIGS. 10, 11A and 11B to 13A and 13B, there are shown the output waveforms at position X and Y when controlling the volume gain according to the level attenuation of audio data, respectively with a first level below 6-dB, a second level below 12-dB and a third level below 0-dB.

The digital signal processing circuit 10 processes the audio data digitally recorded on a tape or disk to generate 16-bit digital audio data. Such audio data is inputted into the input terminal DI of the digital level control circuit 20, which receives via the terminal MDTA the level control data from a system controller and combines the audio data with the control word for each level attenuation of 0 to −36dB, thereby controlling the digital level. Namely, the digital level control circuit 20 separates the right and left channels of the digital audio data imparted with a 7-bit control data for controlling the volume level, and generates audio and control data of the corresponding channel to each output terminal DOL of the left channel (L—CH) and each output terminal DOR of the right channel (R—CH) together with the bit clock BCK for transmission of the data and the word clock WCK for separation of the audio and control data of the data. The data from the terminals DOR and DOL of the digital level control circuit 20 have the construction as shown in FIG. 6, wherein one word for each of the L—CH and R—CH is totally 23 bits comprising 16 bits audio word and 7 bits control word. The audio word is 16-bit audio data, while the control word is the control data determined according to the level attenuation of the audio word to control the gain of the audio data. Referring FIG. 7, the construction of the control word of 7 bits is to form one bit for each level control step. Namely, the bits of the control word are set corresponding to the corresponding attenuation level, as specifically shown in FIG. 8.

The DOL and DOR outputs of the digital level control circuit 20 are respectively applied to the first and second control signal detecting circuits 30 and 50, and the first and second digital to analog converters 40 and 60. Herein, since the construction and its operation of controlling the gain for the digital audio data of both the L—CH and R—CH is same to each other channel, the gain control operation will be described only with reference to the left-hand channel L—CH, for the purpose of easy understanding.

Figure 7:
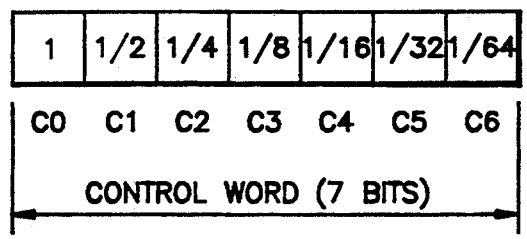
FIG. 7 illustrates the bit format of a control word.

Referring to FIG. 4 for illustrating the structure of the control signal detecting circuits 30, 50, the digital data detecting circuit 110 detects, according to the word clock of the control data period, the control word as shown in FIG. 7, from the data generated from the digital level control circuit 20, excluding the audio data. Subsequently, the serial-to-parallel converter 120 converts the detected serial control word into a parallel data to produce the signals C0-C6 for controlling the analog switch, which signals are delivered through the buffer 130 to the first gain control circuit 70.

Meanwhile, the DOL output of the digital level control circuit 20 is applied to the first digital to analog converter 40 which is enabled during the word clock interval of the audio data period so as to convert into an analog signal only the 16 bits audio data of the DOL output according to the bit clock. Hence, the first digital to analog converter 40 keeps to generate the analog signal for the original 16 bits audio data regardless of the level attenuation. The output of the first digital to analog converter 40 is controlled by the first gain control circuit 70 according to the state of the control word C0-C6 outputted from the first control signal detecting circuit 30, wherein the control word signals C0-C6 respectively control the analog switches S0-S6. In the construction of the first gain control circuit 70, the resistors R0-R6 and RF and the operational amplifier OP1 constitute an inverting type amplifier, wherein the analog switches S0-S6 are on or off according to the state of the control word C0-C6, thus varying the gain. Namely, if S0 is on, the output voltage of the operational amplifier OP1 is Vout = −RF/Ro * Vin, while if S6 is on, Vout = −RF/R6 * Vin. Hence, if the switches S0-S6 are controlled by the control word C0-C6, and the input resistors R0-R6 respectively connected to the switches are properly determined, the level attenuation of the digital audio data may be controlled. In FIG. 4, assuming R0=RF=R, wherein R is a specified resistance value, R1=2R, R2=4R, R3=8R, R4=16R, R5=32R, and R6=64R, then the following relationship will be obtained:

If $C0 = 1$, then $Vout = -\frac{RF}{R0} Vin = -Vin$

If $C1 = 1$, then $Vout = -\frac{RF}{R1} Vin = -\frac{1}{2} Vin$

If $C2 = 1$, then $Vout = -\frac{RF}{R2} Vin = -\frac{1}{4} Vin$

If $C3 = 1$, then $Vout = -\frac{RF}{R3} Vin = -\frac{1}{8} Vin$

If $C4 = 1$, then $Vout = -\frac{RF}{R4} Vin = -\frac{1}{16} Vin$

If $C5 = 1$, then $Vout = -\frac{RF}{R5} Vin = -\frac{1}{32} Vin$

If $C6 = 1$, then $Vout = -\frac{RF}{R6} Vin = -\frac{1}{64} Vin$

In the meanwhile, it will be understood from FIG. 9 the operation of the first gain control circuit 70, whereby the level of the audio signal is controlled according to the state of the control word, as shown above.

The L—CH audio signal whose gain is controlled as above is filtered through the first low pass filter 90. Likewise, the gain of the 16-bit digital audio data of the R—CH is controlled using the 7-bit control word. Hence, the second control signal detecting circuit 50, second digital to analog converter 60, second gain control circuit 80 and second low pass filter 100 operate respectively in the same manner as the first control signal detecting circuit 30, first digital to analog converter 40, first gain control circuit 70 and first low pass filter 90.

Referring to FIGS. 10, 11 to 13 for illustrating the gain control of the audio signal according to the level attenuation, the digital level control circuit 20 receiving the level control data from a system controller performs the operations for a given input digital audio data, when the level control attenuation is separately assigned for 0 to −36dB, presented to the control word of the output data. Namely, C0 of the control word is logically "1" for attenuation of 0 to −5.9dB, while C1 is "1" for dampening of −6dB to −11.9dB. If the attenuation is below −6dB, there occurs the bit down as described above so as to deteriorate the sound quality, which deterioration may be however prevented by using an analog type gain control circuit. For example, as shown in FIGS. 12A and 12B, if the attenuation is −6dB to −11.9dB, and also the 16-bit digital level data is operated with 6dB reduction by an external analog gain control circuit, then the digital level control may be properly performed with preventing the deterioration of the sound quality.

The above described operation and results in accordance with the present invention are likewise applied for the cases below −12dB, −18dB, −24dB, and −36dB.

As stated above, according to the present invention, when the digital volume of the digital audio system is controlled by performing the operation with the digital audio data, the control word is added according to the level attenuation, and the gain of the audio signal operated by the gain control circuit is controlled according to the state of the control word, so that the digital level control is performed with prevention of the sound quality deterioration.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A circuit for preventing deterioration of sound quality in a digital volume control circuit in a digital audio system, said circuit comprising:
    a digital signal processing circuit for generating digital audio data;
    digital level controller means, coupled to said digital signal processing circuit, for receiving level control signals indicative of an amount of level attenuation of said digital audio data from a system controller, for receiving said digital audio data, and for generating combined data by combining said digital audio data with level control data determined according to said level control signals;
    first and second channel control data detecting circuits, driven by word clock signals generated during word periods of said level control data from said digital level controller means, for detecting said level control data contained in said combined data;
    first and second channel serial-to-parallel converters for receiving said level control data in a serial format from said first and second channel control data detecting circuits, and for providing said level control data in a parallel format;
    first and second buffers for receiving and buffering said level control data in said parallel format received from said first and second serial-to-parallel converters;
    first and second digital-to-analog converters for converting said digital audio data in said combined data received from said digital level controller means into analog audio signals; and
    first and second gain controller means, operatively connected with said first and second buffers, for receiving and controlling a gain of said analog audio signals in response to each state of said level control data received from said first and second buffers.

2. A circuit as claimed in claim 1, wherein said combined data are comprised of combined words, each of said combined words having bits allocated to said digital audio data and having bits allocated to said level control data.

3. A circuit as claimed in claim 1, wherein each of said first and second gain controller means comprises:
    a plurality of switch and resistor pairs, each pair including a switch and a resistor coupled in series, each of said switches for receiving a corresponding bit of said parallel level control data at a control terminal, and
    an amplifier having a first input receiving a combined output of said plurality of switch and resistor paris, and a feedback resistor connected between said first input of said amplifier and an output terminal, whereby on the basis of the state of the level control data, said switches are operated to control the gain of the analog audio signals.

4. A circuit for preventing deterioration of sound quality in a digital volume control circuit of a digital audio system, said circuit comprising:
    digital processing circuit means for generating digital audio data;
    digital level controller means for receiving level control information governing an amount of level attenuation of said digital audio data from a system controller, and for combining said digital audio with said level control information to generate a combined signal comprising said digital audio data with level control data determined by and representative of said level control information;
    digital data detecting means driven by word clock signals generated for each word period of said level control data from said digital level controller means, for detecting said level control data in said combined signal;
    serial-to-parallel converter means for converting said level control data detected by said digital data detecting means from a serial format to a parallel format;

buffer means for buffering said level control data in said parallel format from said serial-to-parallel converter means;

digital-to-analog converter means for converting said digital audio data received from said digital level controller means into analog audio signals; and gain controller means for controlling a gain of said analog audio signals in response to each state of said level control data received said buffer means.

5. A circuit as claimed in claim 4, further comprised of first channel and a second channel for conductance of said digital audio data, wherein said digital data detecting means, said serial-to-parallel converter means, said buffer means, said digital-to-analog converter means, and said gain controller means independently process data from each of said first channel and second channel to control the gain of said analog audio signals for each of said first channel and second channel.

6. A circuit as claimed in claim 4, wherein said gain controller means comprises:

a plurality of switch and resistor pairs each receiving said analog audio signals at a first terminal, each of said plurality of switch and resistor pairs comprising a switch and a first resistor coupled in series, and each of said switches being controlled by a corresponding bit of said level control data, and an amplifier having a first input connected with a second terminal of each of said plurality of switch and resistor pairs, and having a feedback resistor connected between said first input and an output of said amplifier, whereby on the basis of the state of the level control data, the switches are operated to control the gain of said analog audio signals.

7. A circuit as claimed in claim 4, wherein words of said combined signal are each comprised of level control data of seven bits per word.

8. A circuit as claimed in claim 7, wherein a word of said level control data represents instantaneous digital level attenuation of a corresponding word of said digital audio data.

9. A circuit as claimed in claim 6, further comprising filter means for filtering noise in an output signal from said amplifier.

10. A circuit as claimed in claim 4, wherein said combined signal is comprised of combined words, each of said combined words having bits allocated to said digital audio data and having bits allocated to said level control data.

* * * * *

UNITED STATES PATENT AND TRADEMARK OFFICE
CERTIFICATE OF CORRECTION

PATENT NO. : 5,263,092
DATED      : 16 November 1993
INVENTOR(S) : Sung-Chul Jang It is certified that error appears in the above-indentified patent and that said Letters Patent is hereby corrected as shown below:

On the title page, item [75], change "Chui" to --Chul--.

Signed and Sealed this

Twenty-third Day of August, 1994

Attest:

BRUCE LEHMAN

Attesting Officer     Commissioner of Patents and Trademarks